(12) United States Patent
Harvey et al.

(10) Patent No.: US 7,769,425 B2
(45) Date of Patent: Aug. 3, 2010

(54) MAGNETIC RESONANCE DEVICE AND METHOD

(75) Inventors: Paul Royston Harvey, Eindhoven (NL); Willem Marten Prins, Eindhoven (NL); Zhiyong Zhai, Mayfield Heights, OH (US); Miha Fuderer, Eindhoven (NL); Gerrit Hendrik Van Yperen, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 483 days.

(21) Appl. No.: 11/575,527

(22) PCT Filed: Sep. 13, 2005

(86) PCT No.: PCT/IB2005/053002

§ 371 (c)(1), (2), (4) Date: Mar. 19, 2007

(87) PCT Pub. No.: WO2006/033047

PCT Pub. Date: Mar. 30, 2006

(65) Prior Publication Data

US 2009/0137896 A1   May 28, 2009

(30) Foreign Application Priority Data

Sep. 24, 2004   (EP)   ................... 04104666

(51) Int. Cl.
A61B 5/05   (2006.01)

(52) U.S. Cl. ...................................................... 600/410
(58) Field of Classification Search .................. 600/411
See application file for complete search history.

(56) References Cited

U.S. PATENT DOCUMENTS 6,424,154 B1   7/2002   Young (Continued)

FOREIGN PATENT DOCUMENTS

WO   2004061469 A1   7/2004

OTHER PUBLICATIONS

Ibrahim, T. S., et al.; Dielectric resonances and B1 field inhomogeneity in UHFMRI: computational analysis and experimental findings; MRM; 2001; vol. 19; pp. 219-226.

(Continued)

*Primary Examiner*—Long V Le
*Assistant Examiner*—Hien Nguyen

(57) ABSTRACT

A device performs MR imaging of a body (7) placed in a stationary and substantially homogeneous main magnetic field, with an RF transmit antenna (6) for radiating RF pulses towards the body (7), which RF transmit antenna (6) has different resonance modes. In order to improve image uniformity in high field MR imaging, the device (1) is arranged to determine the size and/or the aspect ratio of the body (7), and to acquire an MR image of the body (7) by an imaging sequence including RF pulses. The phases and amplitudes of the different resonance modes of the RF transmit antenna (6) excited during irradiation of the RF pulses are controlled on the basis of the size and/or aspect ratio of the body (7).

11 Claims, 2 Drawing Sheets

U.S. PATENT DOCUMENTS

Figure 1:
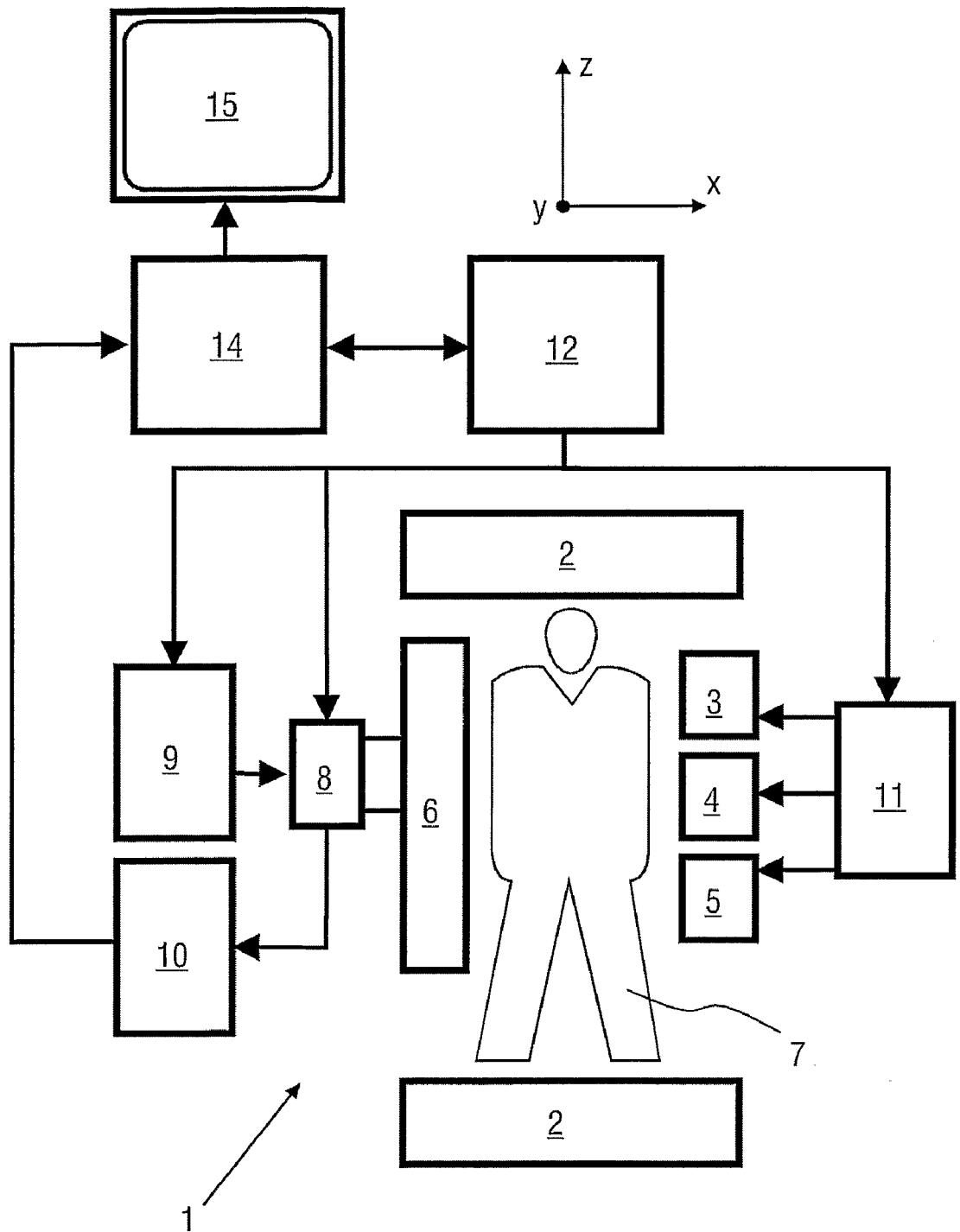

| | | |
|---|---|---|
| 6,501,274 B1 | 12/2002 | Ledden |
| 6,650,118 B2 | 11/2003 | Leussler |
| 6,906,518 B2 | 6/2005 | Leussler |
| 2003/0020475 A1 | 1/2003 | Leussler |
| 2003/0122546 A1* | 7/2003 | Leussler ................... 324/318 |
| 2004/0012391 A1 | 1/2004 | Vaughan et al. |
| 2005/0140369 A1 | 6/2005 | Feiweier et al. |

OTHER PUBLICATIONS

Junge, S., et al.; Current sheet antenna array—a transmit/receive surface coil array for MRI at high fields; Proc. Intl. Soc. Mag. Reson. Med. 11; p. 41.

* cited by examiner

MAGNETIC RESONANCE DEVICE AND METHOD

The invention relates to a device for magnetic resonance (MR) imaging of a body placed in a stationary and substantially homogeneous main magnetic field.

Furthermore, the invention relates to a method for MR imaging and to a computer program for an MR imaging device.

In MR imaging, pulse sequences consisting of radio frequency (RF) pulses and switched magnetic field gradients are applied to an object (a patient) to generate phase encoded MR signals. Known MR imaging devices have an appropriate transmit antenna for the generation of the RF pulses, while the MR signals are scanned by means of a receiving antenna in order to obtain information from the object and to reconstruct images thereof. The transmit antenna and the receiving antenna are often physically the same part of the employed MR device.

Since its initial development, the number of clinical relevant fields of application of MR imaging has grown enormously. MR imaging can be applied to almost every part of the body, and it can be used to obtain information about a number of important functions of the human body. The pulse sequence which is applied during an MR scan determines completely the characteristics of the reconstructed images, such as location and orientation in the object, dimensions, resolution, signal-to-noise ratio, contrast, sensitivity for movements, etcetera. An operator of an MRI device has to choose the appropriate sequence and has to adjust and optimize its parameters for the respective application.

As MR imaging is nowadays performed at static magnetic fields in excess of 1.5 Tesla, so-called dielectric resonances become a major concern. The resonance frequency (Larmor frequency) rises in accordance with the increase in field strength. As a consequence, the wavelength in tissue of the applied RF pulses becomes smaller and becomes comparable to both the dimensions of the RF antennas of the MR device and the anatomical structures of the examined body. Furthermore it has to be taken into account that the human body is asymmetrical and inhomogeneously structured and contains electrically lossy materials (mainly water). Because of this, very strong electromagnetic interactions occur between the RF antennas and the tissue of the examined body. These interactions, usually referred to as dielectric resonances, do not only affect the distribution of the absorption of the RF radiation inside the body (so-called SAR distribution) but also the image uniformity, since the distribution of the RF magnetic field ($B_1$) exciting nuclear magnetization inside the examined body is no longer uniform.

Therefore it is readily appreciated that there is a need for an improved device for magnetic resonance imaging which enables the acquisition and reconstruction of high quality MR images with uniform image intensity at high field strength in excess of 1.5 Tesla.

In accordance with the present invention, a device for MR imaging of a body placed in a stationary and substantially homogeneous main magnetic field is disclosed. The RF transmit antenna of the device has different resonance modes, and the device is arranged to determine the size and/or the aspect ratio of the body, and to acquire MR images of the body by means of an imaging sequence comprising RF pulses, wherein the phases and amplitudes of the different resonance modes of the RF transmit antenna excited during irradiation of the RF pulses are controlled on the basis of the size and/or the aspect ratio of the body.

The invention is mainly based on the insight that the extent of the non-uniformity of the radio frequency field significantly depends on the absolute size and on the aspect ratio of the examined body. For example, in more "round" patients good image uniformity is achieved while in more "flat" patients the image intensity is less uniform. It has been found out that in regions inside the examined body, where the $B_1$ field is low and consequently the image has reduced intensity, the RF field is no longer behaving as a quadrature field. This is because the dielectric resonances account for spoiling the constructive interference of the two orthogonal modes of the quadrature RF field such that the actually desired uniform $B_1$ field can not be obtained within the complete volume of interest. It turns out that image uniformity can be improved in accordance with the invention when the different (quadrature) modes of the RF transmit antenna of the MR device are excited independently of each other with different phases and amplitudes which are tailored to the individual size and/or aspect ratio of the examined body.

The invention provides an MR imaging device being arranged to control the phases and amplitudes of the resonance modes of the RF transmit antenna in accordance with the previously determined size and/or aspect ratio of the examined body. Therefore, the invention enables the generation of high quality MR images with significantly improved uniformity of image intensity at high magnetic field strength.

In accordance with the present invention it is advantageous to determine the size and/or aspect ratio of the body by means of a calibration procedure. This calibration procedure involves the acquisition of either a three- or two-dimensional low resolution image or at least two projection MR images. The calibration on a per patient basis in this way requires only a minimum of additional time for signal acquisition, since the quality of the acquired images for calibration purposes must merely suffice to determine e.g. the width and the height of the examined body. The aspect ratio can simply be computed from the calibration images as the ratio of the different dimensions of the body in two orthogonal directions.

The proposed MR device can advantageously comprise a transmit unit connected to two or more separate transmit channels of the device. Each of these transmit channels can be associated with one of the resonance modes of the RF receiving antenna, wherein the phases and amplitudes of the RF signals supplied to the separate transmit channels are individually controllable by means of the transmit unit. This enables the control of the phases and amplitudes of the different resonance modes of the RF transmit antenna on the basis of the previously determined size and/or aspect ratio of the examined body in accordance with the invention.

In order to further optimise the image quality of the images acquired in accordance with the present invention, the MR device can comprise a receiving unit connected to two or more receiving channels, each of which being associated with one of the resonance modes of the RF transmit antenna. In this way, the RF transmit antenna is used also for the purpose of signal acquisition from the examined body and enables the signal acquisition independently in the different modes of the antenna. Dielectric resonance effects have to be considered not only when exciting nuclear magnetization in transmit mode but also when detecting MR signals from the examined body in receiving mode. The independent reception over the separate channels allows to compensate for the above-described disturbing influences of dielectric resonance effects in the receiving mode of the MR device. Therefore, the MR device can easily be arranged to control the phases and amplitudes of the independently acquired signals in accordance with the size and/or aspect ratio of the patient, for example by simple digital post-processing of the acquired signals during image reconstruction.

The MR device of the invention should advantageously comprise computer means with a program control being arranged to select the phases and amplitudes of the different resonance modes from a lookup table or a functional (mathematical) relationship relating the size and/or the aspect ratio of the body to corresponding phase and amplitude values. The lookup table or the functional relationship have to be determined only once for the MR device before it can be used in accordance with the invention. This can be achieved for example by means of computer simulations relating different phase and amplitude values for different aspect ratios to image uniformity. From these simulations the most suitable phase and amplitude values for the different modes of the transmit antenna can be selected and stored in the lookup table for a plurality of different size intervals and/or aspect ratios. Similarly, the lookup table or the appropriate mathematical function can be established from measurements on a series of volunteers with different sizes and/or aspect ratios.

The invention not only relates to a device but also to a method for MR imaging of at least a portion of a body placed in a stationary and substantially homogeneous main magnetic field, the method comprising the following steps:

determination of the size and/or aspect ratio of the body, and acquisition of an MR image of the body by means of an imaging sequence comprising RF pulses, wherein the phases and amplitudes of different resonance modes of an RF transmit antenna excited during generation of the RF pulses are controlled independently on the basis of the size and/or aspect ratio of the body.

A computer program adapted for carrying out the MR imaging procedure of the invention can be implemented on common computer hardware, which is in clinical use for the control of appropriate magnetic resonance scanners. The computer program can be provided on suitable data carriers, such as CD-ROM or diskette. Alternatively, it can also be downloaded by a user from an internet server.

It can be concluded that the gist of the invention is that by means of suitable control of the RF antenna arrangement of an MR imaging device it is possible to considerably improve the image intensity, contrast and uniformity of MR images obtained from high field MR systems in which dielectric resonances and reduced RF penetration presently cause undesirable image quality problems.

The following drawings disclose preferred embodiments of the present invention. It should be understood, however, that the drawings are designed for the purpose of illustration only and not as a definition of the limits of the invention.

IN THE DRAWINGS

Figure 2:
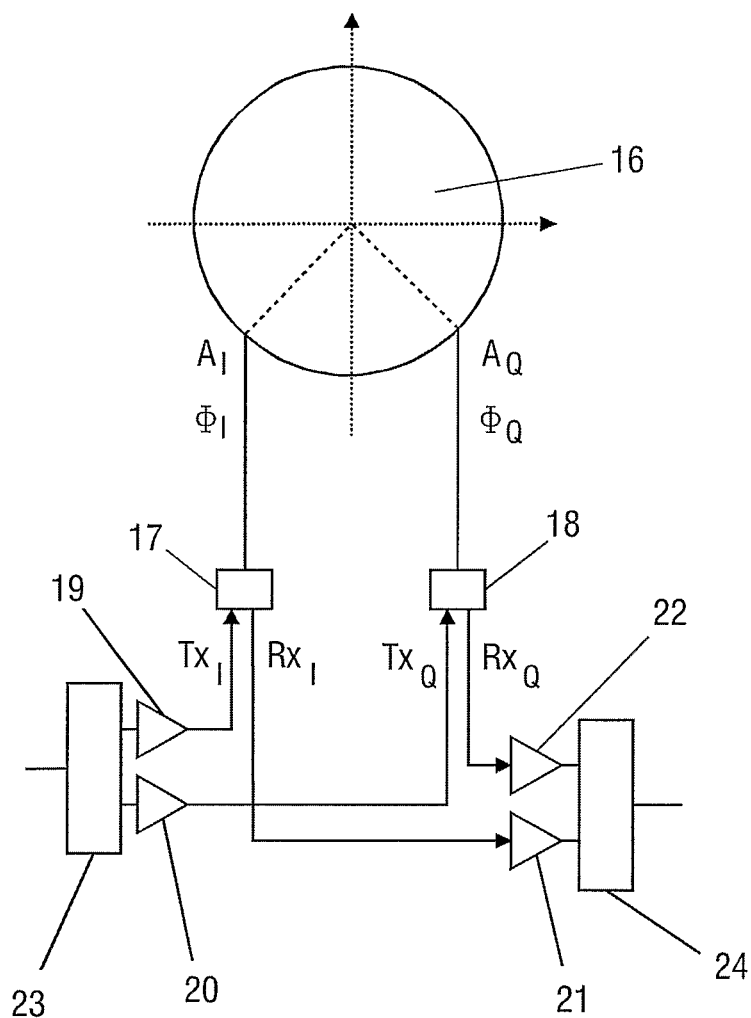
Figure 3:
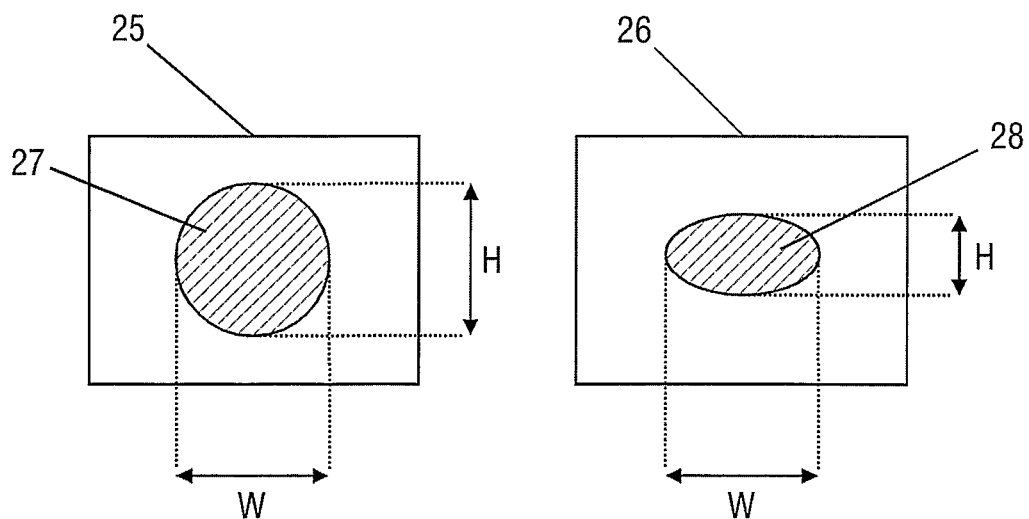

FIG. 1 shows an embodiment of a magnetic resonance scanner according to the invention, FIG. 2 shows an embodiment of an RF antenna architecture in accordance with the invention, FIG. 3 illustrates a calibration scheme in accordance with the invention.

In FIG. 1 an MR imaging device 1 in accordance with the present invention is shown as a block diagram. The apparatus 1 comprises a set of main magnetic coils 2 for generating a stationary and homogeneous main magnetic field and three sets of gradient coils 3, 4 and 5 for superimposing additional magnetic fields with controllable strength and having a gradient in a selected direction. Conventionally, the direction of the main magnetic field is labelled the z-direction, the two directions perpendicular thereto the x- and y-directions. The gradient coils 3, 4, and 5 are energized via a power supply 11. The apparatus 1 further comprises an RF transmit antenna 6, for example a conventional quadrature body coil, for emitting RF pulses to a body 7. Being a quadrature coil, the antenna 6 has two resonance modes that are conventionally excited by RF signals having the same amplitudes and a phase difference of 90°. In accordance with the invention, the antenna 6 is connected to a receive/transmit unit 8 for controlling the phases and amplitudes of the two different resonance modes of the antenna 6. The receive/transmit unit 8 is further coupled to a modulator 9 for generating and modulating the RF pulses. As shown in FIG. 1, the RF transmit antenna and the receiving antenna are physically the same antenna 6. Therefore, the transmit/receive unit 9 is arranged to separate the received signals from the RF pulses to be emitted. The received MR signals are input to a demodulator 10. The transmit/receive unit 8, the modulator 9, and the power supply 11 for the gradient coils 3, 4 and 5 are controlled by a control system 12. Control system 12 controls the phases and amplitudes of the RF signals fed to the antenna 6 on the basis of the aspect ratio of the body 7. The control system 12 is usually a microcomputer with a memory and a program control. For the practical implementation of the invention, particularly with regard to determination of the aspect ratio of the body 7 and for selection of the appropriate phase and amplitude values of the resonance modes of the antenna 6, the control system 12 comprises a programming with a description of a procedure as described herein before. The demodulator 10 is coupled to a data processing unit 14, for example a computer, for transformation of the received echo signals into an image that can be made visible, for example, on a visual display unit 15.

FIG. 2 illustrates a coil architecture in accordance with the invention. A quadrature body coil 16 is connected via corresponding terminals to separate channels I and Q of an MR apparatus not shown in FIG. 2. Each of the channels I and Q is associated with one of the two orthogonal resonance modes of coil 16. The coil 16 serves for excitation of MR signals in the examination volume and for detection thereof. Provision is made for two send/receive switches 17 and 18 for each of the channels I and Q. By means of these switches the terminals of the coil 16 are connected either to the output terminals of power amplifiers 19, 20 or to sensitive RF preamplifiers 21, 22, that is, in dependence of the mode of operation of the MR device. During irradiation of RF pulses in transmit mode, phases $\Phi_I, \Phi_Q$ and amplitudes $A_I, A_Q$ of the RF signals $Tx_I$ and $Tx_Q$ supplied to the coil 16 over the respective channels are controlled by means of a transmit unit 23. This allows for the adjustment of the phases $\Phi_I, \Phi_Q$ and the amplitudes $A_I, A_Q$ for each individual transmit channel corresponding to the aspect ratio of the examined body, such that an optimum uniformity of the excited nuclear magnetization is achieved in accordance with the invention. The independent control of amplitudes and phases can be achieved either by means of separate power amplifiers 19, 20 as shown in FIG. 2, wherein the amplifiers are under individual control of the transmit unit 23, or by controlled splitting of the RF output of a single power amplifier using delay lines and attenuators controlled by the transmit unit 23. For independent reception of signals $Rx_I$, $Rx_Q$ over the channels I and Q, provision is made for separate RF preamplifiers 21, 22 being connected to a receiving unit 24. The receiving unit 24 must not necessarily be able to control the phases and amplitudes of signals $Rx_I$, Rx. The adaption of phases and amplitudes of the received signals to the aspect ratio of the patient can be carried out as a pure post-processing step during final image reconstruction.

While in FIG. 2 a quadrature body coil is depicted, it will be understood that the method of the invention is applicable to any RF coil design using multiple resonance modes.

FIG. 3 shows MR slice images 25, 26 as acquired and reconstructed during a pre-scan calibration procedure in accordance with the invention. The calibration procedure serves for determination of the size and or the aspect ratio of the examined body. MR image 25 shows a more "round" body 27 while the body 28 shown in image 26 has a more "flat" cross section. The respective aspect ratios can easily be computed as the quotient of width W and height H of bodies 27, 28. The phases and amplitudes of the resonance modes of the employed RF antenna can then be optimized in terms of image uniformity on the basis of the size and/or the aspect ratio determined in this way. The appropriate amplitude and phase values can be obtained for example by reference to a lookup table. This lookup table reflects the known relationship between image uniformity, size, aspect ratio and phase/amplitude relations of the different resonance modes of RF antenna. This allows for an effective optimization of MR image uniformity on a per patient basis in medical applications.

The invention has been described with reference to the preferred embodiments. Modifications and alterations may occur to others upon reading and understanding the preceding detailed description. It is intended that the invention be constructed as including all such modifications and alterations insofar as they come within the scope of the appended claims or the equivalents thereof.

The invention claimed is:

1. A device for MR imaging of a body comprising:
   a magnetic coil configured to generate a stationary and substantially homogeneous magnetic field;
   an RF transmit antenna configured to radiate RF pulses towards the body, wherein RF transmit antenna has different resonance modes; and
   a computer with a program control configured to determine an aspect ratio of the body, and acquire an MR image of the body by an imaging sequence comprising RF pulses, wherein phases and amplitudes of the different resonance modes of the RF transmit antenna excited during irradiation of the RF pulses are controlled on the basis of the aspect ratio of the body.

2. The device of claim 1, wherein the computer with the program control is further configured to determine the aspect ratio of the body by a calibration procedure, wherein the calibration procedure involves the acquisition of either a low resolution MR image or at least two projection MR images of the body.

3. The device of claim 2, wherein the computer with the program control is configured to compute the aspect ratio from the MR images acquired during the calibration procedure as the ratio of dimensions of the body in two orthogonal spatial directions.

4. The device of claim 1, further comprising a transmit unit connected to two or more separate transmit channels, each transmit channel being associated with one of the resonance modes of the RF transmit antenna, wherein the phases and amplitudes of the RF signals supplied to the separate transmit channels are individually controllable by the transmit unit.

5. The device of claim 1, further comprising a receiving unit connected to two or more separate receiving channels of the device, each receiving channel being associated with one of the resonance modes of the RF transmit antenna.

6. The device of claim 1, wherein the computer with the program control is configured to select the phases and amplitudes of the different resonance modes on the basis of a lookup table or a functional relationship relating the aspect ratio of the body to corresponding phase and amplitude values.

7. A method for MR imaging at least a portion of a body placed in a stationary and substantially homogeneous main magnetic field, with an RF transmit antenna for radiating RF pulses towards the body, which RF transmit antenna has different resonance modes, the method comprising the following steps:
   with a computer, determining an aspect ratio of the body; and
   from an MR imaging device, acquiring an MR image of the body by an imaging sequence comprising RF pulses, wherein phases and amplitudes of different resonance modes of an RF transmit antenna excited during generation of the RF pulses are controlled independently on the basis of the aspect ratio of the body.

8. The method of claim 7, wherein the aspect ratio of the body is determined by a calibration procedure involving the acquisition of either a low resolution MR image or at least two projection MR images of the body.

9. The method of claim 7, wherein the phases and amplitudes of the different resonance modes are selected on the basis of a lookup table or a functional relationship relating the aspect ratio of the body to corresponding phase and amplitude values.

10. A tangible machine readable media comprising a computer program for an MR imaging device, with instructions for:
   determining an aspect ratio of a body placed in a stationary and substantially homogeneous main magnetic field of the MR imaging device,
   controlling the acquisition of MR image data of the body by an imaging sequence comprising RF pulses,
   selecting phases and amplitudes of different resonance modes of an RF transmit antenna excited during generation of the RF pulses on the basis of the aspect ratio of the body.

11. The tangible machine readable media comprising a computer program of claim 10, further comprising instructions for selecting the phases and amplitudes of the different resonance modes on the basis of a lookup table or a functional relationship relating the aspect ratio of the body to corresponding phase and amplitude values.

* * * * *